(12) United States Patent
Best

(10) Patent No.: US 7,668,679 B2
(45) Date of Patent: Feb. 23, 2010

(54) INDIVIDUAL DATA LINE STROBE-OFFSET CONTROL IN MEMORY SYSTEMS

(75) Inventor: Scott C. Best, Palo Alto, CA (US)

(73) Assignee: Rambus Inc., Los Altos, CA (US)

( * ) Notice: Subject to any disclaimer, the term of this patent is extended or adjusted under 35 U.S.C. 154(b) by 0 days.

(21) Appl. No.: 11/621,491

(22) Filed: Jan. 9, 2007

(65) Prior Publication Data

US 2007/0109908 A1    May 17, 2007

Related U.S. Application Data

(63) Continuation of application No. 10/923,421, filed on Aug. 20, 2004, now Pat. No. 7,171,321.

(51) Int. Cl.
*G01R 35/00* (2006.01)

(52) U.S. Cl. .......................... 702/106; 702/72; 702/79; 365/189.07; 365/193; 365/194

(58) Field of Classification Search .................. None
See application file for complete search history.

(56) References Cited

U.S. PATENT DOCUMENTS

| | | | |
|---|---|---|---|
| 4,410,916 A | 10/1983 | Pratt et al. |
| 4,687,954 A | 8/1987 | Yasuda |
| 4,926,447 A | 5/1990 | Corsetto et al. |
| 5,060,239 A | 10/1991 | Briscoe et al. |
| 5,334,883 A | 8/1994 | Rosenthal |
| 5,341,371 A | 8/1994 | Simpson |
| 5,655,105 A | 8/1997 | McLaury |
| 5,805,619 A | 9/1998 | Gardner et al. |
| 5,832,303 A | 11/1998 | Murase et al. |
| 5,935,257 A | * 8/1999 | Nishimura ................ 713/503 |
| 5,978,281 A | * 11/1999 | Anand et al. ........... 365/189.05 |
| 6,023,174 A | 2/2000 | Kirsch |

(Continued)

FOREIGN PATENT DOCUMENTS

DE          19920335          9/2000

(Continued)

OTHER PUBLICATIONS

International Preliminary Report on Patentability and Written Opinion of the International Searching Authority in International Application PCT/US2005/028709, European Patent Office, Mar. 1, 2007, 13 pages.

(Continued)

*Primary Examiner*—Manuel L Barbee
(74) *Attorney, Agent, or Firm*—Mahamedi Paradice Kreisman LLP

(57) ABSTRACT

Systems and methods for strobe signal timing calibration and control in strobe-based memory systems are provided below. These strobe-offset control systems and methods receive a strobe signal from a memory device and in turn automatically generate separate per-bit strobe signals for use in receiving data on each data line of a memory system. The systems/methods generate the optimal per-bit strobe signals by automatically calibrating per-bit offset timing between data signals of individual data bits and corresponding strobe signals. The strobe-offset control system effectively removes the detected phase difference between the data signal and the strobe signal.

20 Claims, 13 Drawing Sheets

U.S. PATENT DOCUMENTS

| | | | |
|---|---|---|---|
| 6,028,816 | A | 2/2000 | Takemae et al. |
| 6,055,587 | A | 4/2000 | Asami |
| 6,279,073 | B1 | 8/2001 | McCracken |
| 6,316,980 | B1 | 11/2001 | Vogt |
| 6,396,887 | B1 | 5/2002 | Ware |
| 6,466,491 | B2 | 10/2002 | Yanagawa |
| 6,498,766 | B2 | 12/2002 | Lee |
| 6,512,704 | B1 | 1/2003 | Wu et al. |
| 6,570,800 | B2 | 5/2003 | Tanaka |
| 6,570,944 | B2 | 5/2003 | Best |
| 6,643,787 | B1 | 11/2003 | Zerbe |
| 6,646,929 | B1 | 11/2003 | Moss |
| 6,646,953 | B1 | 11/2003 | Stark |
| 6,675,272 | B2 | 1/2004 | Ware |
| 6,691,214 | B1 | 2/2004 | Li et al. |
| 6,707,723 | B2 | 3/2004 | Jeong |
| 6,759,881 | B2 | 7/2004 | Kizer et al. |
| 6,782,459 | B1 | 8/2004 | Ware |
| 6,819,157 | B2 | 11/2004 | Cao |
| 6,836,503 | B2 | 12/2004 | Best |
| 6,836,521 | B2 | 12/2004 | Ware |
| 6,930,932 | B2 | 8/2005 | Rentschler |
| 6,940,760 | B2 | 9/2005 | Borkenhagen et al. |
| 6,940,768 | B2 | 9/2005 | Dahlberg |
| 7,031,205 | B2 | 4/2006 | Han |
| 2001/0020278 | A1 | 9/2001 | Saito |
| 2002/0009004 | A1 | 1/2002 | Hamada et al. |
| 2002/0149397 | A1 | 10/2002 | Dally et al. |
| 2003/0065465 | A1 | 4/2003 | Johnson et al. |
| 2003/0091136 | A1 | 5/2003 | Sugita |
| 2003/0179611 | A1* | 9/2003 | Liou ........................ 365/193 |
| 2003/0221050 | A1 | 11/2003 | Hong et al. |
| 2004/0044919 | A1 | 3/2004 | Dabral |
| 2004/0084537 | A1 | 5/2004 | Best |
| 2004/0213067 | A1 | 10/2004 | Best |
| 2004/0230715 | A1 | 11/2004 | Huang |
| 2005/0005056 | A1 | 1/2005 | Ware |
| 2005/0071707 | A1 | 3/2005 | Hampel |
| 2005/0110544 | A1 | 5/2005 | Suda et al. |
| 2005/0141294 | A1 | 6/2005 | Bonelli |
| 2005/0163203 | A1 | 7/2005 | Ware |

FOREIGN PATENT DOCUMENTS

| | | |
|---|---|---|
| WO | WO98/44674 | 10/1998 |
| WO | WO99/17183 | 4/1999 |

OTHER PUBLICATIONS

Altera, "Using Source-Synchronous Signaling with DPA in Stratix GX Devices," Application Note 236, pp. 1-18, Altera Corporation, Jan. 2003, available at http://www.altera.com/literature/an/an236.pdf.

CMOS Parallel-to-Serial FIFO 256×16, 512×16, 1024×16, pp. 1-10, Integrated Device Technology Corporation, Dec. 1999, available at http://www.digchip.com/datasheets/parts/datasheet/222/IDT72105.php.

Collins, Hansel A. and Nikel, Ronald E., "DDR-SDRAM, high-speed, source-synchronous interfaces create design challenges", EDN, Sep. 2, 1999, pp. 63, 64, 66, 68, 70, 72 available at http://wwww.ednmag/reg/1999/090299/18ms544.htm.

DDR-SDRAM-2: Detailed Specifications, FIND, Nov. 1998, pp. 1-14, vol. 16, No. 4.

DDR-SDRAM-4: DLL Circuit Technology, FIND, Nov. 1998, pp. 1-4, vol. 16, No. 4.

Horowitz, Hill: "The Art of Electronics" (second edition), 1989, Cambridge, p. 231-232.

IBM Corporation, "PowerPC Embedded Processors PowerPC 440GP-DDR SDRAM Controller Initialization", Hopewell Junction, NY., Mar. 20, 2002, pp. 1-9.

Khatib, Jamil, "FIFO, First-In-First Out Memory," pp. 1-6, Mar. 28, 1999, available at http://www.geocities.com/Silicon Valley/Pines/6639/ip/fifo.html.

Rajpal, Suneel, et al., "Designing with FIFOs," Technical Note TN-06, pp. 1-2, Integrated Device Technology Coroporation, Nov. 1997, available at http://www.elektroniknet.de/fileadmin/user upload/IDT/TN-062020Designing20with20Async2OFIFOs.pdf.

Ryan, Kevin, "DDR SDRAM Functionality and Controller Read Data Capture", Micron Technology, Inc. DesignLine, 1999, pp. 1-24, vol. 8, Issue available at www.micron.com/mti/msp/html/dlindex.html.

Schumann, T. and Klar, H., "An Asynchronous up/down Counter for Control of a Self-timed, Wave-pipelined Array Mutiplier," Abstract, ACiD-WL Workshop, Groningen, the Netherlands, Sep. 1996, available at http://mikro.ee.tuberlin.de/forschung/sgemos/abstractACiD.ps.gz.

SN74ALVC7804 512×8 First-In, First-Out Memory, SCAS432, pp. 1-10 & Addendum pp. 1-3, Texas Instruments Corporation, Jan. 1995, available at http://focus.ti.com/lit/ds/symlink/sn74alvc7804.pdf.

Tech Brief 31: Using Delay Lines to Generate Multi-Phased Clocks, p. 1, Dallas Semiconductor Corporation, Dec. 12, 2001, available at http://www.maximic.com/appnotes.cfm/appnote_number/880.

XILINX, "Using the XC9500 Timing Model," Application Note XAPP071, pp. 2-9 to 2-12, XILINX Corporation, Jan. 1997, available at http://direct.xilinx.com/bvdocs/appnotes/xapp071.pdf.

Ajanta Chakraborty: "Efficient Self-Timed Interfaces for Crossing Clock Domains," thesis submitted to Department of Computer Science, University of British Columbia, Aug. 2003, 74 pgs.

Jens Muttersbach, Thomas Villiger, Worfgang Fichtner: "Practical Design of Globally-Asynchronous Locally-Synchronous Systems," Sixth International Symposium on Advanced Research in Asynchronous Circuits and Systems (ASYNC 2000), 8 pgs.

* cited by examiner

INDIVIDUAL DATA LINE STROBE-OFFSET CONTROL IN MEMORY SYSTEMS

RELATED APPLICATIONS

This application is a Continuation of U.S. patent application Ser. No. 10/923,421, filed Aug. 20, 2004, now U.S. Pat. No. 7,171,321 and entitled INDIVIDUAL DATA LINE STROBE-OFFSET CONTROL IN MEMORY SYSTEMS, which is hereby incorporated by reference in its entirety.

TECHNICAL FIELD

The disclosure herein relates generally to memory systems and methods. In particular, this disclosure relates to systems and methods for transferring information among memory devices and a memory controller.

BACKGROUND

High-speed processor-based electronic systems have become all-pervasive in computing, communications, and consumer electronic applications to name a few. The pervasiveness of these systems, many of which are based on multi-gigahertz processors, has led in turn to an increased demand for the systems to host a larger number of applications having a higher level of complexity than those applications hosted on electronic systems of previous generations. The transfer of information and signals required among the components of these high-speed systems in support of these applications has led to increasing demands for interfaces to support the efficient high-speed transfer of information. Examples of such interfaces include the interfaces between processors and memory devices of high-speed systems.

One memory type typically used in high-speed processing systems is double-data rate dynamic random access memory (DRAM). The double-data rate DRAM is typically twice as fast as a single data rate DRAM running at the same clock speed because a double-data rate DRAM transfers data on both the rising and falling edge of the clock.

While the use of double-data rate memory systems leads to increases in data transfer speeds, issues arise regarding the timing of the data transfer, particularly where a memory controller receives data sent by a double data rate DRAM attached thereto using a strobe-based method. Using this strobe-based method, a strobe signal (also referred to as the DQS signal) is edge-aligned to and accompanies a data signal (also referred to as the DQ signal) sent by the DRAM. This DQS is used by the controller to capture the data signal sent by the DRAM. The DQS signal and the data are received and the DQS signal is delayed by some fixed amount, usually one-fourth of the memory system clock period. This delayed DQS signal, which is approximately in quadrature with the received data, is then used as a common sample clock for each of the DQ input receivers in typically a byte or 8 bits of data sent in parallel. Due to system offsets and pin-to-pin offsets in the DRAM (commonly referred to on DRAM datasheets as "tDQSQ"), however, one strobe-delay value for the whole byte cannot be the ideal amount of strobe-delay for every pin. Furthermore, while manual adjustment of per-bit offsets can yield higher performing memory systems, requiring manual adjustments of these offsets in a production memory system tends to be expensive.

In some memory systems, calibration is performed by affecting the read and write timing positions of the memory controller based on pattern comparisons. For example, to calibrate the read timing of a system, a DRAM can be instructed to provide a known pattern to the controller. The controller then adjusts its read-clock timing position to determine the pass-fail regions (e.g., when a comparison between the received data and the expected data fails, the controller determines that phase position to be in a fail region). Once the pass-fail regions for the entire data-eye are known, the controller chooses an optimal read-clock position centered within the known passing region. A strobe-delay value can be subsequently determined for this optimal read-clock position.

Timing-calibrated memory systems which eliminate pin-to-pin timing variation can give better performance than strobe-based memory systems which use per-byte strobes, but they are substantially more complex. Consequently, there is a need in high-speed, strobe-based memory systems, for per-pin (data bit) strobe-offset control and timing calibration to minimize DQS-to-DQ timing offsets for each DQ pin individually, yielding more robust, higher-speed systems.

BRIEF DESCRIPTION OF THE DRAWINGS

In the drawings, the same reference numbers identify identical or substantially similar elements or acts. To easily identify the discussion of any particular element or act, the most significant digit or digits in a reference number refer to the Figure number in which that element is first introduced (e.g., element 120 is first introduced and discussed with respect to FIG. 1).

DETAILED DESCRIPTION

Figure 1:
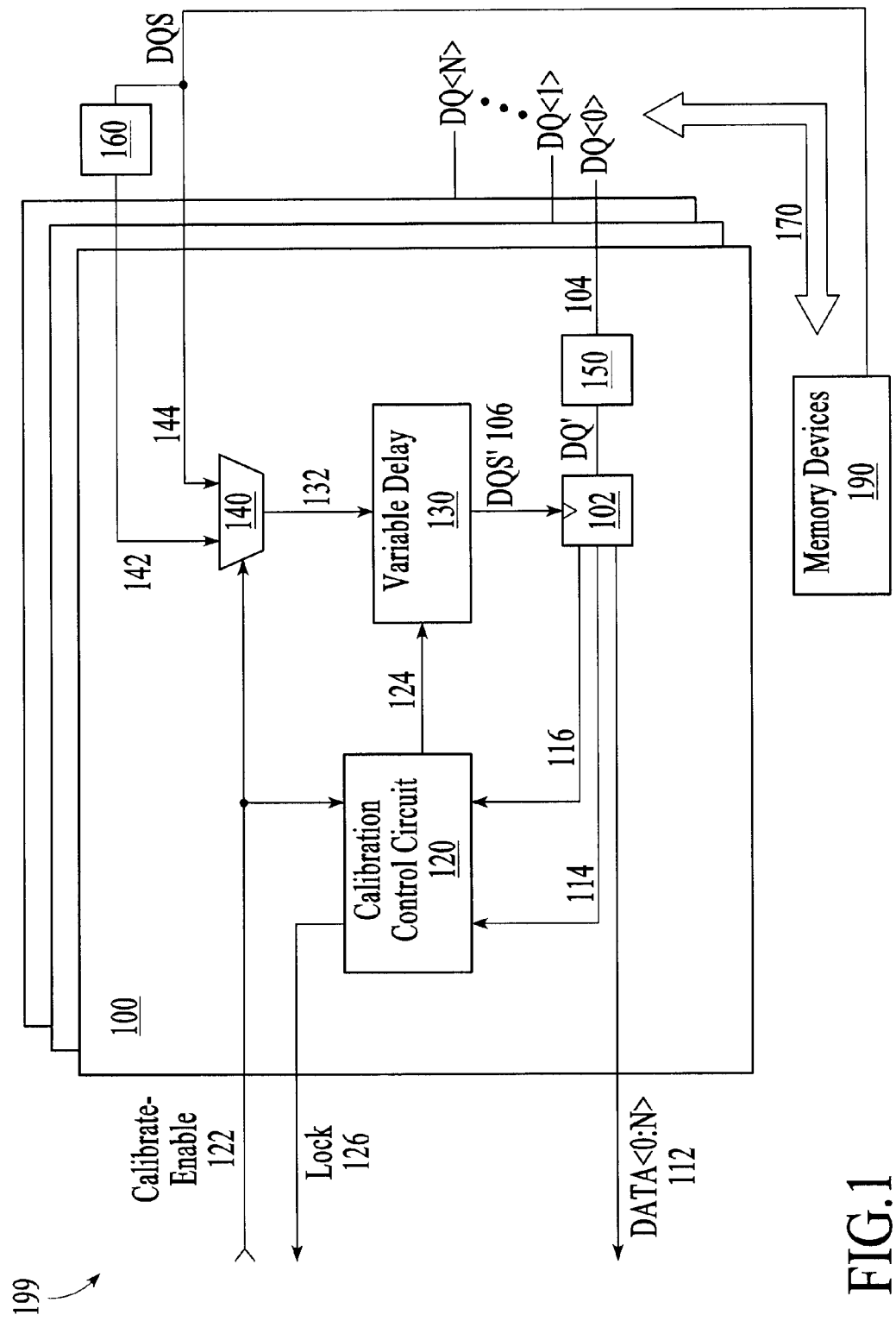
FIG. 1 is a block diagram of a strobe-based memory system including a strobe-offset control system for individual data line strobe-offset control, under an embodiment.

Systems and methods for strobe signal timing calibration and control in strobe-based memory systems are provided below. These systems and methods, also referred to herein as strobe-offset control systems and methods, receive a strobe signal from a memory device and in turn generate separate per-bit strobe signals for use in receiving data on an external data line or signal line of a memory system. The systems/methods generate the optimal per-bit strobe signals by automatically calibrating per-bit offset timing between data signals DQ<X> of individual data lines (where DQ<X> represents any one of a number of data lines DQ<N:0>, where X is any of data lines 0, 1, 2 ... N) and corresponding strobe signals DQS. The strobe signals DQS are also referred to as strobes and data strobes. The strobe-offset control system is for use in strobe-based memory systems which include, for example, double data rate (DDR) systems like DDR SDRAM as well as DDR2 SDRAM and other DDR SDRAM variants, such as reduced latency DRAM (RLDRAM), RLDRAM2, Graphics DDR (GDDR) and GDDR2, GDDR3, but is not limited to these memory systems.

The strobe-offset control system generally includes a calibration control circuit coupled to a variable delay element, both of which couple to a receiver. When operating in a calibration mode, the receiver functions as a phase detector and the combination of the receiver, calibration control circuit and variable delay element can effectively form a delay-locked loop (DLL) circuit. This DLL circuit, in response to phase information of the data signals and corresponding strobe signals, adjusts the phase relationship between the strobe signals and the data signals for each received data bit by adjusting an offset or delay value applied to the strobe signal. The delay value is adjusted, for example, to optimally edge-align the data signal DQ<X> and corresponding strobe signal DQS, but is not so limited. The optimal edge-alignment can be with respect to the rising edge or falling edge of the data DQ<X> and strobe DQS signals. The optimal delay value, once determined, is maintained and the system is subsequently placed in a receiver mode.

In the receiver mode, the receiver now functions as an input sampler or data signal sampler. The delay value determined during the calibration mode is applied to the strobe signals DQS received from the memory devices to generate a per-bit quadrature (i.e., approximately 90 degree phase offset) sample signal DQS' (also referred to as per-bit strobe signal DQS'); the per-bit strobe DQS' is output for use by the input sampler in receiving data of a corresponding data signal DQ<X>. Use of the delay value effectively removes the detected phase difference between the data signal DQ<X> and the strobe signal DQS, thereby optimizing the overall timing margin for that specific data bit DQ<X> during data transfer operations.

In the following description, numerous specific details are introduced to provide a thorough understanding of, and enabling description for, embodiments of the strobe-offset control system. One skilled in the relevant art, however, will recognize that these embodiments can be practiced without one or more of the specific details, or with other components, systems, etc. In other instances, well-known structures or operations are not shown, or are not described in detail, to avoid obscuring aspects of the disclosed embodiments. As an example, the strobe-offset control embodiments described herein are presented in the context of transferring individual data bits DQ<X> with the understanding that the disclosed concepts apply to all data transferred during memory system operations.

FIG. 1 is a block diagram of a strobe-based memory system 199 including a strobe-offset control system 100 for individual data line strobe-offset control, under an embodiment. The strobe-based memory system 199 is a component of and/or coupled to a host system or device (not shown) as appropriate to the host system/device. A strobe-offset control system 100 is coupled to receive data of each data line of the memory system 199, and can include and/or couple with additional components as appropriate to the memory system 199 or host electronic system. The strobe-offset control system 100 includes a receiver 102 with a data input coupled to a data signal DQ<X> via a data line 104 through at least one data delay element 150. The data signal DQ<X> includes information of one data bit of an N-bit wide data byte transferred to the receiver 102 from one or more memory devices 190 via one or more signal lines or buses 170. The receiver 102 samples the data signal DQ<X> in response to the sample signal DQS' 106 as described below and outputs data signal 112 that includes data <0:N>.

The strobe-offset control system 100 also includes a multiplexer 140 that receives a delayed strobe signal at a first input 142 and a strobe signal DQS at a second input 144. The delayed strobe signal is generated from the strobe signal DQS by a strobe delay element 160. The multiplexer 140, under control of a memory controller or other device (not shown) via a calibrate-enable signal 122, provides one of the delayed strobe signal or the strobe signal DQS to an input 132 of a variable delay element 130 as appropriate to operating modes of the strobe-offset control system 100 described below.

The variable delay element 130 receives the output signal of the multiplexer 140 and generates sample signals DQS' 106 by applying a delay to the signals received at the input 132. The variable delay element 130 of an embodiment supports delays approximately in the range of one-sixth (i.e., 60 degrees) to one-third (i.e., 120 degrees) of the memory system clock period, and alternative embodiments support other delay periods as appropriate to the receiver and the desired tuning range of the control system 100. The variable delay element 130 outputs the sample signal DQS' via line 106 to the receiver 102.

The strobe-offset control system 100 also includes a calibration control circuit 120 which can alternatively be referred to as a calibration controller 120. The calibration control circuit 120, under control of a memory controller or other device (not shown) of the memory system 199 via a calibrate-enable signal 122, operates in a calibration mode to adjust an amount of the delay or offset applied by the variable delay element 130 to versions of the strobe signal.

The calibration control circuit 120 of an embodiment uses information of one or more signals received from the receiver 102 in performing adjustments of the variable delay value of delay element 130. One signal received from the receiver 102 is an adjustment control signal 114 that affects the amount of offset applied by the variable delay element 130 as described below. Further, the calibration control circuit 120 receives an optional adjustment valid signal 116 from the receiver 102 that indicates when information of the adjustment control signal 114 is valid, as described below.

As described above, the strobe signal DQS is coupled to a first input of the multiplexer 140 using at least one strobe delay element 160. The strobe delay element 160 applies pre-specified delay or offset to the received strobe signal DQS. The strobe delay element 160 of an embodiment delays the strobe signal DQS by a period of time that is one-fourth of the memory system clock period (i.e., 90 degrees), but alternative embodiments will use delay values appropriate to the receiver type. While the strobe delay element 160 is shown and described as dedicated to each byte, alternative embodiments may use one strobe delay element 160 per bit.

Likewise, the data signal DQ<X> of an embodiment couples to the receiver 102 through at least one data delay element 150. The data signal DQ<X> is transmitted from the memory devices 190 in a read operation, for example. In a strobe-based system, the transmitted data signal DQ<X> is edge-aligned to the transmitted strobe signal DQS. The data delay element 150 applies pre-specified delay to the received data signal DQ<X>, and couples a delayed version of the data signal DQ<X>' (referred to as the delayed data signal) to the receiver 102. The data delay element 150 delays the data signal DQ<X> by an amount that is approximately equal to the median delay of the variable delay element 130, such as one-fourth of the memory system clock period (i.e., 90 degrees), but alternative embodiments will use other delay values. The delayed data signal DQ<X>' is then used as a data input to the receiver 102.

The memory system 199 including the strobe-offset control system 100 operates in a number of modes including calibration and receiver modes. In the calibration mode the receiver 102 generally operates as a phase detector and determines any phase difference between a delayed data signal DQ<X>' and the strobe signal DQS'. When operating as a phase detector the receiver will generally be referred to herein as a receiver/phase detector 102. The receiver/phase detector 102 compares the phase relationship between the strobe signal DQS' and the delayed data signals DQ<X>' for each received data bit, and provides those comparison results to the calibration control circuit 120 via the adjustment control signal 114. In response to the adjustment control signal 114, and optionally in additional response to the adjustment valid signal 116, the calibration control circuit 120 will adjust the delay control signal 124 which affects the delay value applied to the strobe signal DQS via the variable delay circuit 130. In this embodiment, the receiver/phase-detector 102 in combination with the calibration control circuit 120 and the variable delay circuit 130 acts very much like a delay-locked loop circuit (DLL). Once this DLL-like circuit is "locked", the adjusted delay of the variable delay circuit 130, when applied to the strobe signal DQS, results in a per-bit sample signal DQS' that is approximately edge-aligned to the delayed data signal DQ<X>'. Alternatively, at least one of the delay elements 130 or 150 is variable, while at most one of them is fixed, where the relative delay between delays provided by delay elements 130 and 150 are controlled by the calibration control circuit 120. Furthermore, if both delay elements 130 and 150 are variable delay elements, calibration control circuit 120 can additionally control the absolute delay of the delay elements 130 and 150 in addition to their relative values.

In addition to generating information representative of the offset between data and data strobe signals, the calibration control circuit 120 can also store the information for subsequent use and/or processing. As such, the information can be used to characterize the corresponding data paths of the memory system. For example, the data of this characterization can be used to generate offsets for use by the memory controller in memory write operations. This data also has uses in generating predicted offset values for use by the variable delay element 130 during calibration.

Figure 2:
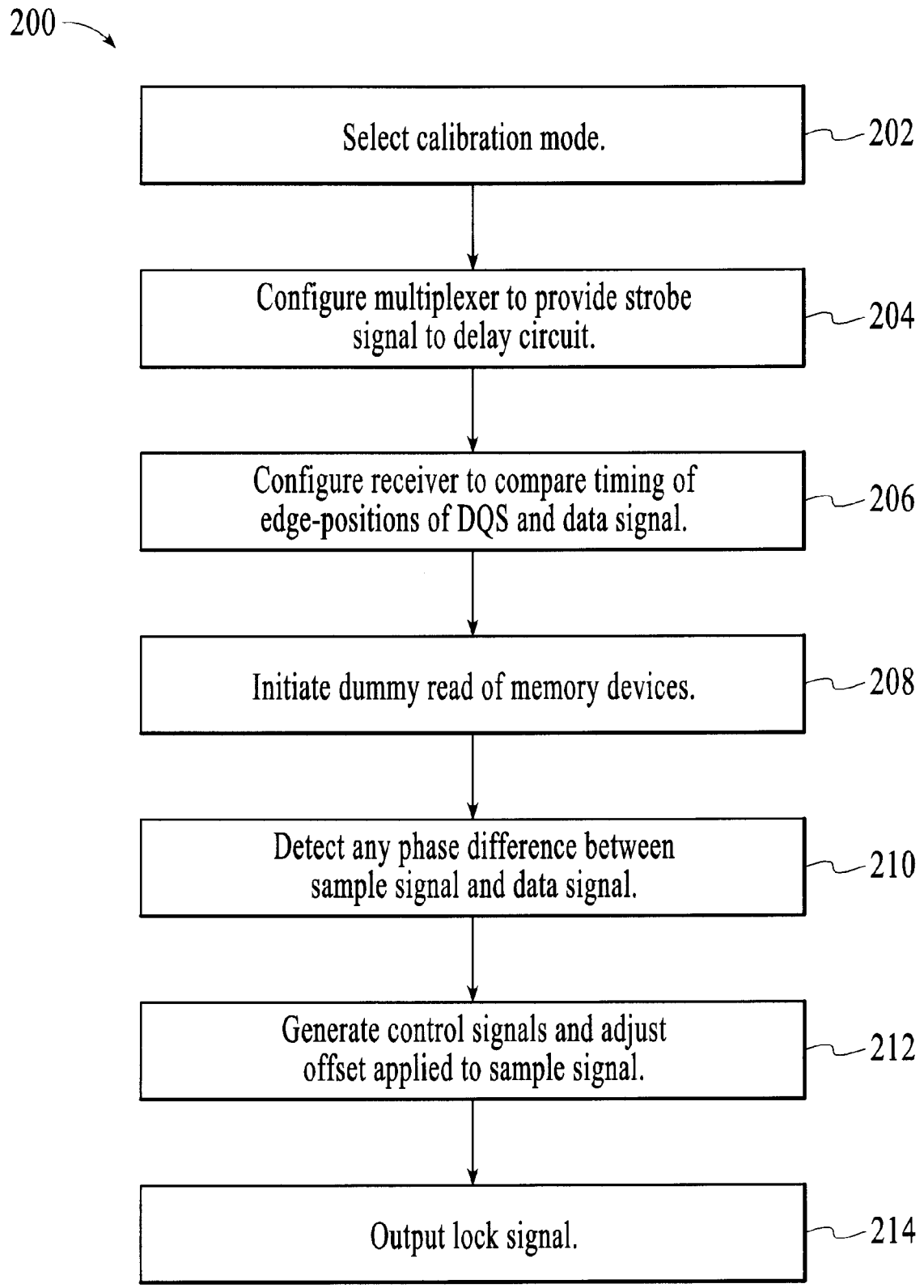
FIG. 2 is a flow diagram for individual data line strobe-offset calibration in a calibration mode, under an embodiment.

FIG. 2 is a flow diagram 200 for individual data line strobe-offset calibration in a calibration mode, under an embodiment. Taking one data line as an example, a state of a calibrate-enable signal places one or more components of the strobe-offset control system in a calibration mode, at block 202. In the calibration mode, a multiplexer is configured to provide the received strobe signal (DQS) to the input of a delay circuit, at block 204. Additionally, the receiver is configured to compare timing of the edge-positions of the delayed sample signal (DQS') and the delayed data signals of the data line, at block 206. A dummy read of the memory devices is initiated, at block 208. A dummy read is generally defined to include a process in which a controller interface circuit makes a read request from the DRAM, independent of any data needs of the central processor or other higher layer machine-readable code; these reads are performed at power-up, or other intervals in which the DRAM was otherwise not being utilized.

In response to the dummy read, data and DQS signals are transmitted from the DRAM, received at the controller, and any phase difference between the delayed sample signal DQS' and the delayed data signal is detected, at block 210. Control signals are generated in response to detected phase differences, and the control signals are used to adjust the amount of variable delay which is applied to either the sample signal or the data signal, at block 212. The variable delay value for each data line, when applied to a per-bit sample signal, optimally edge-aligns the per-bit sample signal to the data signal of that data line, but is not so limited. A lock signal is output in response to determination of the optimal offset, at block 214, but generation of a lock signal is optional as alternative embodiments can determine completion of calibration using any number of other methods.

Following determination and adjustment of the optimal variable delay value the memory system is placed in a receiver mode in which the receiver functions as an input sampler. When operating as an input sampler the receiver will generally be referred to herein as a receiver/input sampler 102. The variable delay value determined/adjusted during the calibration mode is subsequently used in generating a per-bit sample signal for use by the input sampler in receiving data of a corresponding data signal. Use of the variable delay value effectively removes any unwanted offsets between the data signal and the strobe signal, thereby optimizing the overall timing margin between the data signal and the per-bit sample signal during data transfer operations.

Figure 3:
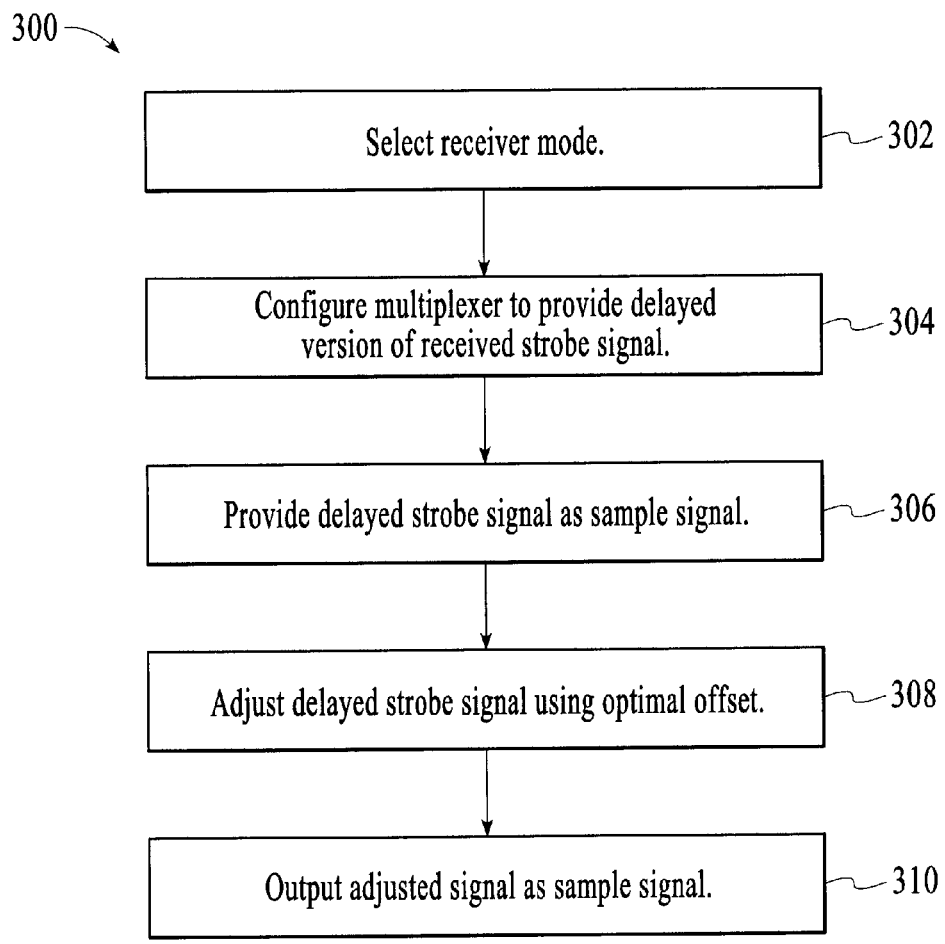
FIG. 3 is a flow diagram for receiving data signals of an individual data line using an optimized sample signal, under an embodiment.

FIG. 3 is a flow diagram 300 for receiving data signals of an individual data line using an optimized sample signal, under an embodiment. Following calibration of the offset, as described above, a state of the calibrate-enable signal places the strobe-offset control system in a receiver mode, at block 302. In the receiver mode, a multiplexer is configured to provide a delayed version of the received strobe signal (DQS) as the input to a second delay circuit, at block 304. The delayed strobe signal is delayed by a period that is approximately one-fourth of the memory system clock period (i.e., 90 degrees). The output of this second delay circuit is provided as a sample signal for sampling data signals of the data line, at block 306. The second delay circuit applies an amount of delay (determined during calibration mode) to the delayed strobe signal, at block 308 (the strobe signal, therefore, is delayed by a total period of approximately one-fourth of the memory system clock period plus the period of the calibrated delay). The twice delayed signal (delayed strobe signal with calibrated applied) is subsequently output as the sample signal for sampling the individual data line, at block 310.

Figure 4:
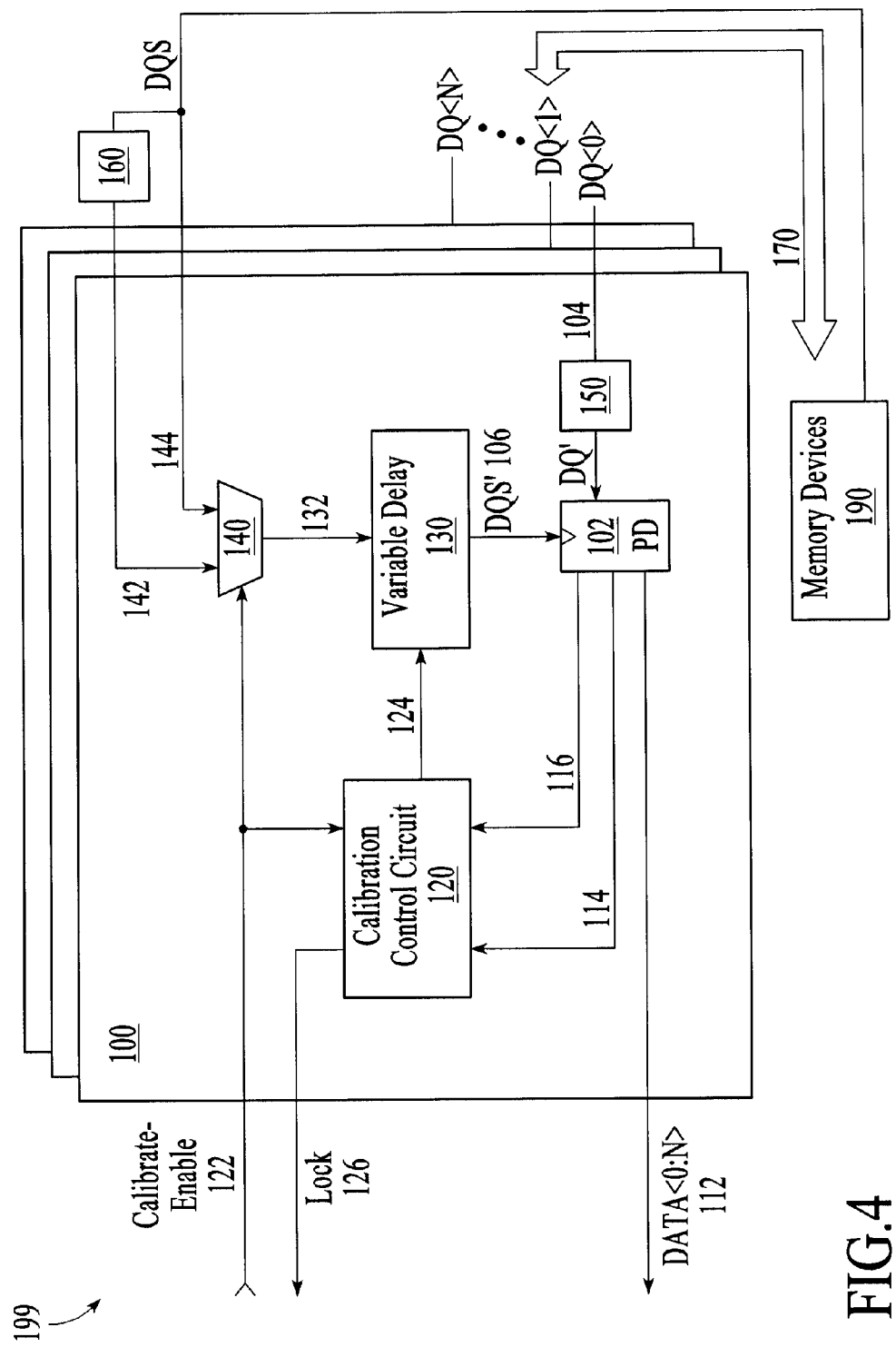
FIG. 4 is a block diagram of a strobe-based memory system including a strobe-offset control system in the calibration mode, under an embodiment.

As a further example of the operating modes described above, FIG. 4 is a block diagram of a strobe-based memory system 199 including a strobe-offset control system 100 in the calibration mode, under an embodiment. The strobe-offset control system 100 and memory system 199 are as described above with reference to FIG. 1. Regarding the calibration mode, a memory controller or other component of the memory system 199 activates the calibrate-enable signals 122 to the strobe-offset control system 100 in response to, for example, initialization or re-initialization of a host system. The active state of the calibrate-enable signal 122 places the calibration control circuit 120 in a calibration mode, and selects the strobe signal DQS (input 144) as the output 132 of the multiplexer 140 and consequently the input of the variable delay element 130. The output of the variable delay element 130 is a delayed version of the input signal, as described below, and is used as a sample signal DQS' 106 input to the receiver.

A dummy read of the memory devices 190 is then initiated by the memory controller (not shown) during which the delayed data signal DQ<X>' is compared with DQS' by the receiver/phase detector 102. In the calibration mode the receiver/phase detector 102 acts as a phase detector (PD) 102 which compares the phase difference between the delayed data signal DQ<X>' and the sample signal DQS'. In response to detected phase differences the receiver/phase detector 102 generates an adjustment control signal 114, and an optional adjustment-valid signal 116. The receiver/phase detector 102 outputs the adjustment control signal 114, and optionally the adjustment-valid signal 116, to the calibration control circuit 120.

The adjustment control signal 114 is an embodiment of a delay-lock loop's (DLL's) up/down signal that the calibration controller 120 uses to affect adjustments to the delay value. The calibration control circuit 120 adjusts the delay applied by the variable delay element 130 via signal lines 124 in response to the adjustment-control and optional adjustment-valid signals 114 and 116. Repeated adjustments of the variable delay value, in a closed-loop manner, results in signal DQS' 106 being optimally aligned (approximately edge-aligned) to the delayed data signal DQ<X>'.

Consequently, the combination of the receiver/phase detector 102, calibration control circuit 120 and variable delay element 130 effectively form a DLL circuit. This DLL circuit, in response to phase information of the delayed data signal DQ<X>' and corresponding delayed strobe signal DQS', adjusts the phase relationship between these signals for each received data bit DQ<X> (where "X" is 0 . . . N, where "N" is the number of bits associated with a given DQS signal) by adjusting a delay applied to the strobe signal DQS. The adjusted delay when applied to the strobe signal DQS results in a per-bit sample signal DQS' that is approximately edge-aligned to the delayed data signal DQ<0>'. An optional lock signal 126 is subsequently output (to the memory controller or other circuitry of the memory system 199) by the calibration control circuit 120 in response to determination of the edge-alignment, but alternative embodiments may not output a lock signal.

In addition to the adjustment control signal 114 described above, the receiver/phase detector 102 of an embodiment outputs a valid signal 116 to the calibration control circuit 120 of an embodiment. The valid signal 116, which is output by the receiver/phase detector 102 to indicate when the adjustment control signal 114 is valid, is used in systems in which the data pattern of the dummy read contains an unequal number of transitions between the data DQ<X> and strobe DQS signals. That is, while DQS is defined to transition once for every bit transmitted, the DQ<X> signal may not transition every bit (e.g., if two or more logic-high or logic-low states are transmitted in a row). In such systems, the valid signal 116 indicates that the DQ<X> to DQS comparison result (i.e., adjustment control signal 114) is valid only when DQ<X> is detected to have transitioned for purposes of the comparison. Thus, the valid signal 116 may not be used in systems in which the data pattern of the dummy read results in an equal number of transitions between the data DQ<X> and strobe DQS signals. Furthermore, in some embodiments the adjustment control signal 114 is the same electrical signal as the output of the input sampler when it is used in input-sampler mode, i.e. data<X> signal 112.

Figure 5:
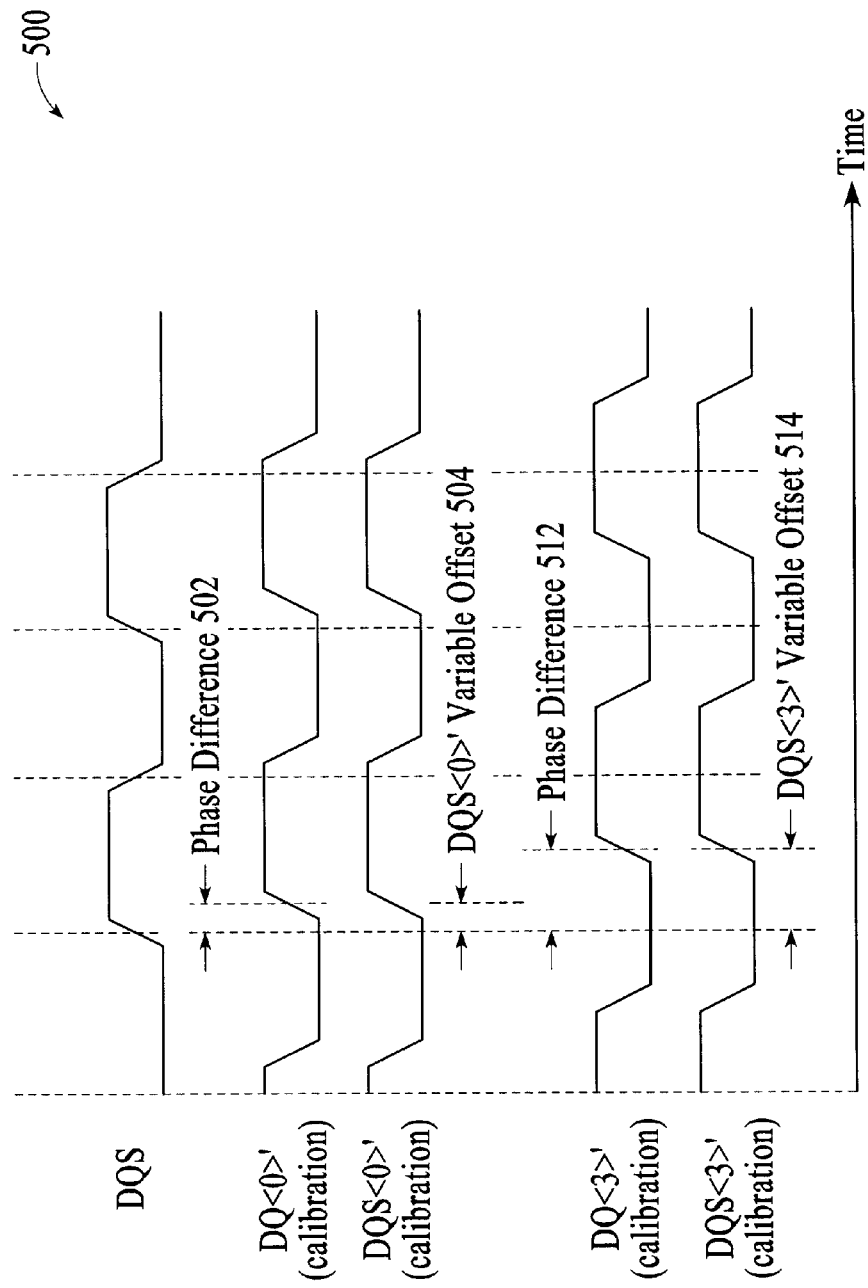
FIG. 5 is a timing diagram showing the determination/application of the optimal per-bit variable delay to a strobe signal to generate per-bit strobe signals during calibration mode, under an embodiment.

FIG. 5 is a timing diagram 500 showing the determination/application of the optimal per-bit variable delay to a strobe signal DQS to generate per-bit strobe signals DQS' during calibration mode, under an embodiment. Two data lines DQ<0> and DQ<3> are shown as examples only, as the methods described herein are similarly applied to all lines DQ<X>. Looking first at delayed data signal DQ<0>', the rising/falling edges of this data signal DQ<0>' during an example dummy read (calibration mode) are offset from the corresponding rising/falling edges of the strobe signal DQS by a first phase difference 502. This phase-difference will, if uncompensated for, limit the maximum bandwidth achievable by the memory system. The receiver/phase detector in combination with the calibration control circuit and variable delay element (collectively the DLL) detects the phase difference 502, adjusts a variable delay 504 to compensate for the phase difference, and applies the adjusted delay 504 to the strobe signal DQS. The result of applying the adjusted delay 504 to the strobe signal DQS for this data line is a per-bit sample signal DQS<0>' that is approximately edge-aligned to the delayed data signal DQ<0>'.

Turning to a second delayed data signal DQ<3>', the rising/falling edges of this data signal DQ<3>' during the example dummy read (calibration mode) are offset from the rising/falling edges of the strobe signal DQS by a second phase difference 512. The DLL (receiver (phase detector), calibration control circuit, variable delay element) detects the phase difference 512, adjusts a variable delay 514 to compensate for the phase difference, and applies the adjusted delay 514 to the strobe signal DQS. The result of applying the adjusted delay 514 to the strobe signal DQS for this data line is a per-bit sample signal DQS<3>' that is approximately edge-aligned to the delayed data signal DQ<3>'.

Figure 6:
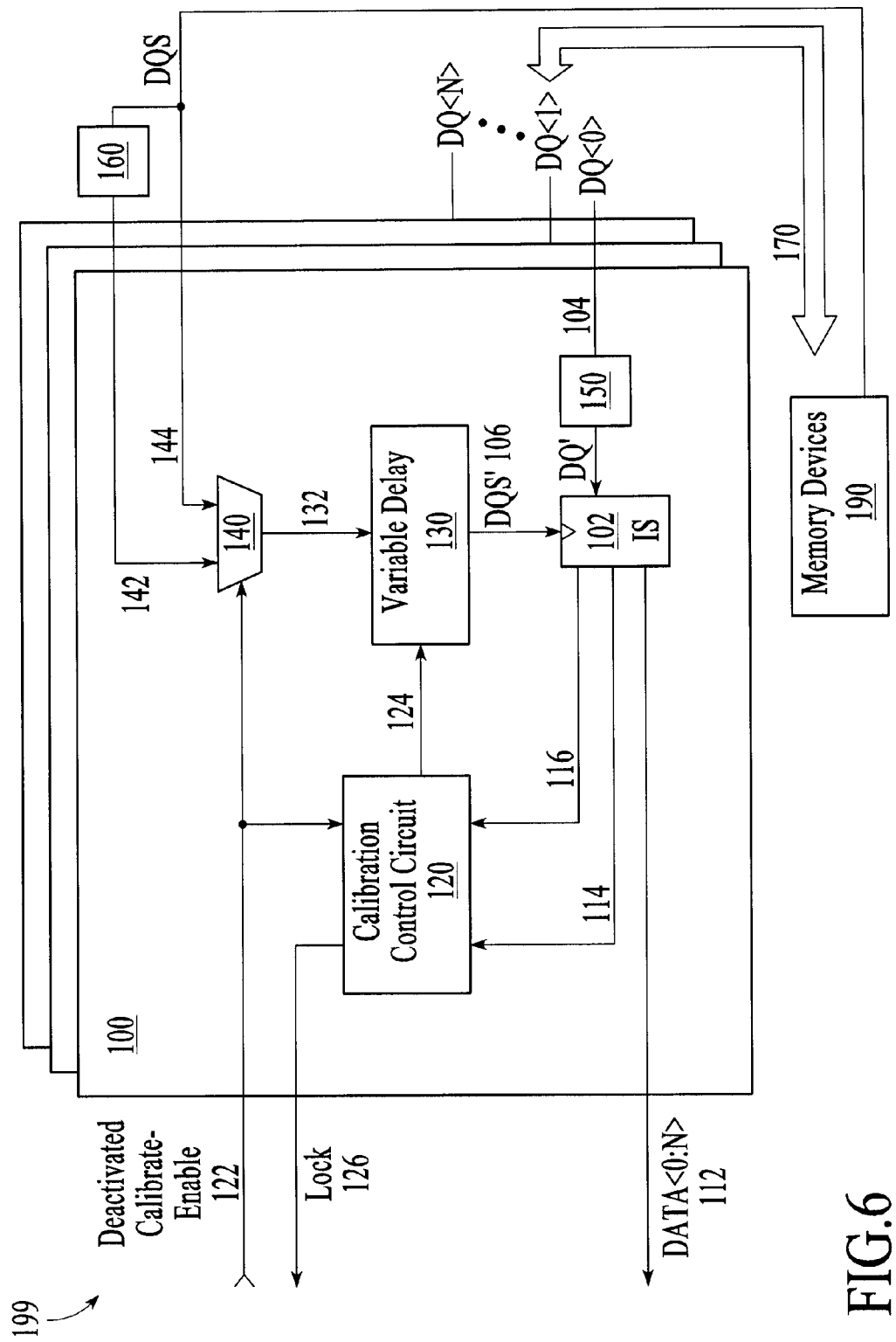
FIG. 6 is a block diagram of a strobe-based memory system including a strobe-offset control system in the receiver mode, under an embodiment.

Subsequent to or simultaneous with determining an optimal amount of variable delay in the calibration mode, the memory system begins operations in the receiver mode. FIG. 6 is a block diagram of a strobe-based memory system 199 including a strobe-offset control system 100 in the receiver mode, under an embodiment. The strobe-offset control system 100 and memory system 199 are as described above with reference to FIG. 1. A memory controller or other component of the memory system 199 places the system in the receiver mode by deactivating the calibrate-enable signal.

The receiver/input sampler 102 operates as an input sampler in the receiver mode and, as such, receives a sample signal DQS' from the variable delay element. The sample signal is generated by the variable delay element by applying the offset determined during the calibration mode to the delayed strobe signal. The variable delay element outputs a per-bit sample signal DQS' to the receiver/input sampler 102 for use in sampling/receiving data of the corresponding delayed data signal DQ<X>'. The receiver/input sampler 102 outputs the sampled/received data on the data lines 112.

Figure 7:
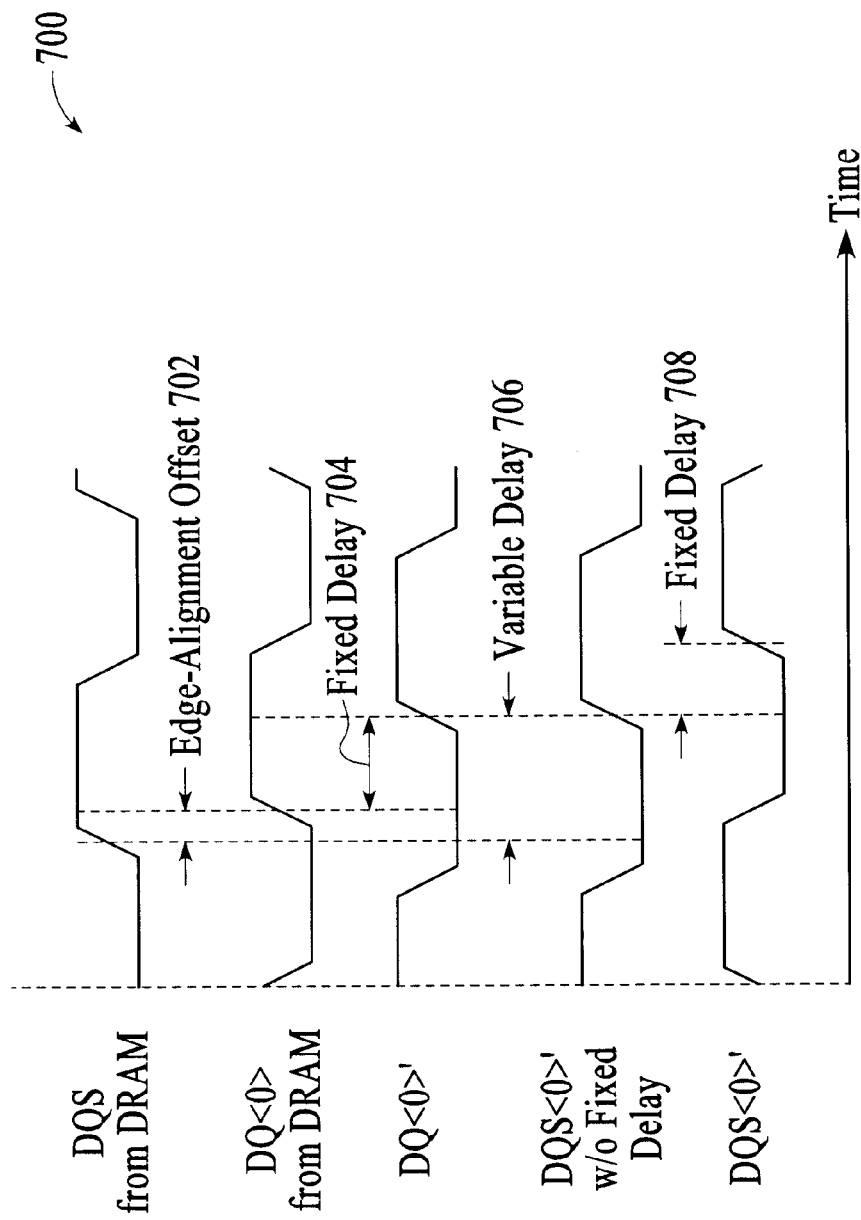
FIG. 7 is a timing diagram showing adjustment of strobe signal timing using an optimal per-bit offset (calibration mode) along with a fixed delay (receiver mode) to generate a per-bit strobe signal with optimal alignment for sampling a corresponding data signal, under an embodiment.

FIG. 7 is a timing diagram 700 showing adjustment of strobe signal timing using an optimal per-bit variable delay along with a fixed delay to generate a per-bit strobe signal with optimal alignment for sampling a corresponding data signal, under an embodiment. One data signal DQ<0> is shown as an example only, as the methods described herein are similarly applied to all data lines DQ<X>. As described above, the strobe-offset control system receives the strobe signal DQS from the memory devices along with the data signal DQ<0>. Due to system offsets and pin-to-pin offsets in the memory devices there is an edge-alignment offset 702 between the strobe signal DQS and the received data signal DQ<0>.

Applying a fixed delay 704 of approximately 90 degrees to the received data signal DQ<0> as described above produces delayed data signal DQ<0>'. During the calibration mode, as described above, the delayed data signal DQ<0>' is compared to the received strobe signal DQS and information of phase/timing differences detected during this process result in adjustment and subsequent application of a variable delay 706 to the received strobe signal DQS. Application of the variable delay 706 to the strobe signal DQS results in per-bit sample signal DQS<0>' (without a fixed delay). The variable delay 706 is approximately equal to the edge-alignment offset 702 plus the fixed delay 704 applied to the data signal DQ<0>. This results in a sample signal DQS<0>' (without a fixed delay) that is approximately edge-aligned with the delayed data signal DQ<0>'.

Following adjustment of the variable delay 706 during calibration mode, a fixed delay 708 of approximately 90 degrees is applied to the strobe signal DQS along with the variable delay 706 to generate the optimal per-bit sample signal DQS<0>' for use by the receiver during normal receive operations. The per-bit sample signal DQS<0>' is optimally positioned relative to the data signal so as to maximize the probability of accurately sampling the delayed data signal DQ<0>'. The amount of per-pin offset that is correctable using the systems and methods herein is the maximum delay difference between the delay available from the variable delay element 130 and the data delay element 150 (FIG. 1). The optimal alignment provided by the systems/methods herein, therefore, overcomes some if not all effects due to system/pin-to-pin offsets.

As described above with reference to FIG. 1, the strobe-offset control system 100 includes data delay elements and strobe delay elements for applying fixed delays to the received data signals and strobe signals, respectively. The strobe-offset control system 100 of another embodiment therefore includes one or more delay element control circuits or controllers for use in controlling tolerances of the delays provided by the strobe and data delay elements.

Figure 8:
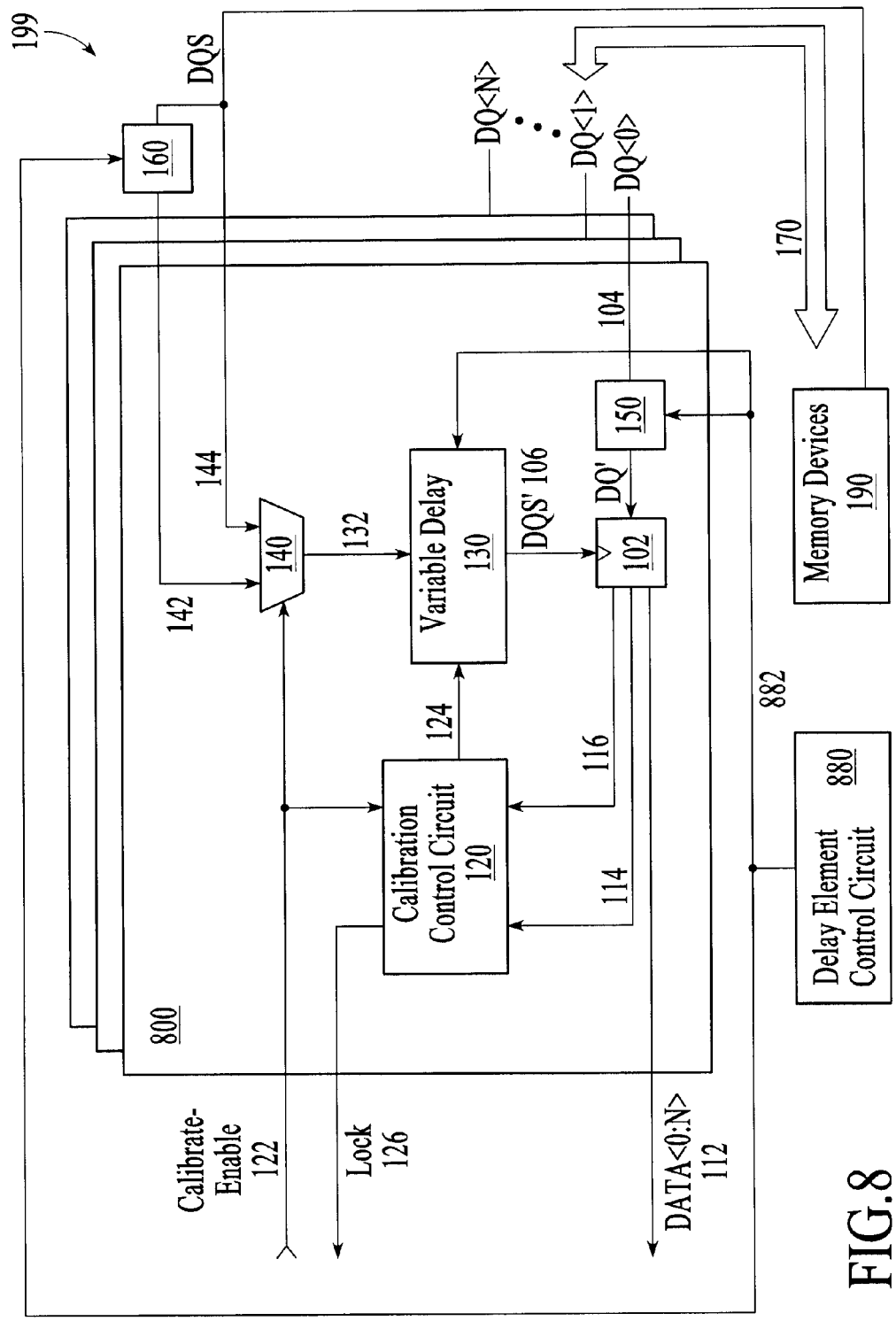
FIG. 8 is a block diagram of a strobe-based memory system including a strobe-offset control system for individual data line strobe-offset control, under an embodiment.

FIG. 8 is a block diagram of a strobe-based memory system 199 including a strobe-offset control system 800 for individual data line strobe-offset control, under an embodiment. The delay element control circuit 880 generates control signals 882 for use in controlling nominal values of the strobe delay element 160, and/or the data delay element 150, and/or the variable delay element 130. While a single delay element control circuit 880 is described below as controlling both the strobe 160 and data 150 delay elements, alternative embodiments can use separate delay element control circuit for each delay element, each type of delay element or for different combinations of delay elements.

Figure 9:
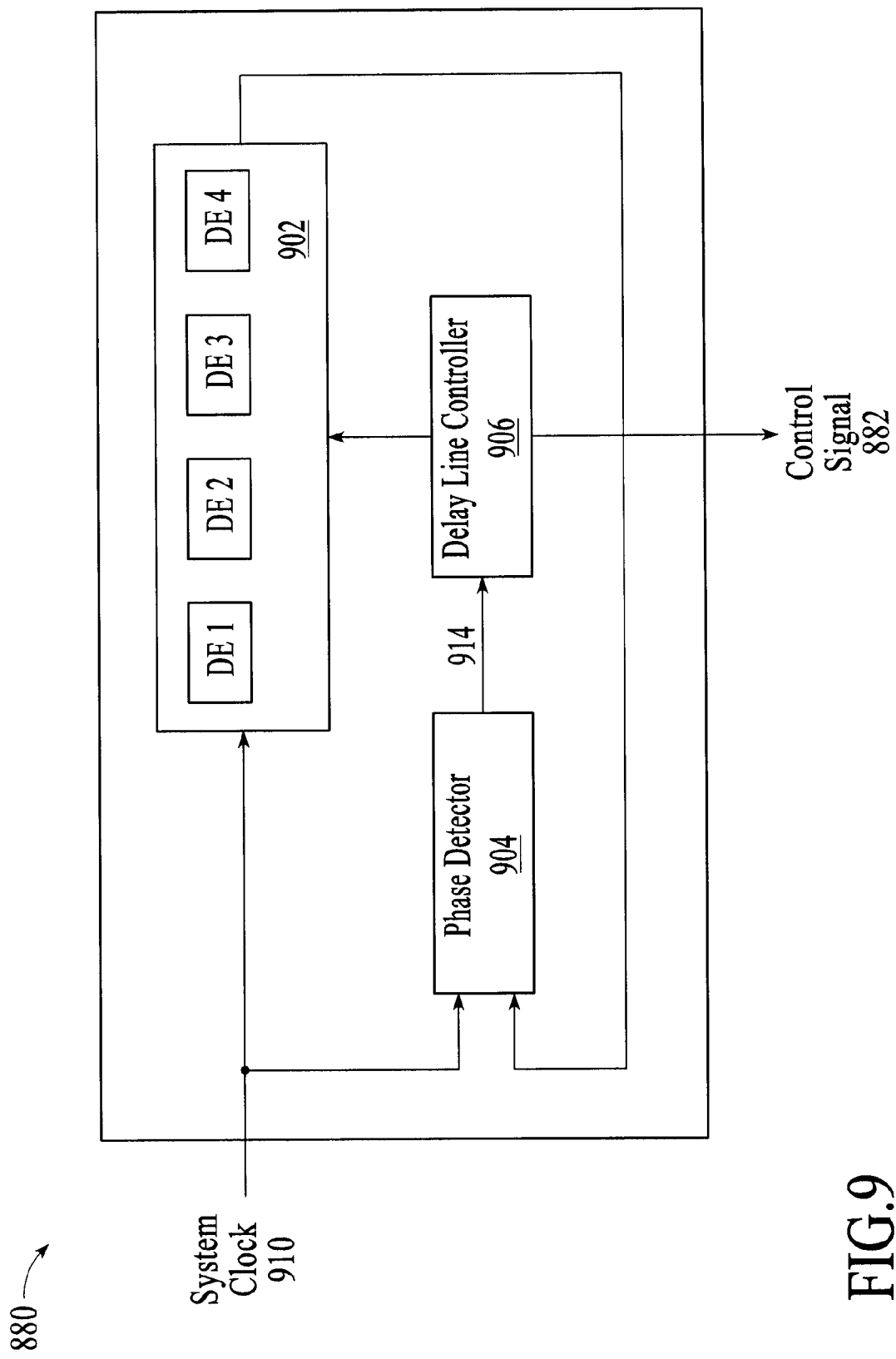
FIG. 9 is a block diagram of a delay element control circuit for use in strobe-based memory controllers, under an embodiment.

FIG. 9 is a block diagram of a delay element control circuit 880 for use in strobe-based memory controllers, under an embodiment. The delay element control circuit 880 controls the respective delays or offsets within a pre-specified range in response to variations in operating or environmental parameters of the host system, memory controller, and/or strobe-offset control system. The operating parameters include, for example, the speed of operation, but can include numerous other parameters as appropriate. The environmental parameters include, for example temperature and/or power supply voltage, but can include numerous other parameters as appropriate.

The delay element control circuit 880 of an embodiment includes a delay line 902, a phase detector 904, and a delay line controller 906. The delay line 902 includes four unit delay elements DE1, DE2, DE3, and DE4 coupled in series and receiving the memory system clock signal 910 as an input; alternative embodiments can include any number of unit delay elements. The delay line 902 provides a total delay that is approximately one period of the memory system clock. Therefore, each of the four unit delay elements DE1-DE4 delays the input clock signal 910 by an amount that is one-fourth of the memory system clock period.

The delay line output couples to the phase detector 904 along with the memory system clock signal 910. The phase detector 904 determines any phase difference between these two input signals and outputs control signals 914 to the delay line controller 906 that include information of the detected phase difference. The delay line controller 906 in turn outputs control signals 882 for use in controlling timing offsets of one or more of the unit delay elements DE1-DE4 in response to the information from the phase detector 904. The delay line controller output signals 882 are also used as control signals for use in setting the nominal delay value of delay elements like the strobe delay element 106, the data delay element 150, and the variable delay element 130. The delay line controller output signals 882 can be any of a variety of signal types known in the art, such as voltage bias signals, current bias signals, or digital delay-control signals. The offsets of the delay elements are controlled within a pre-specified range in response to variations in operating parameters described above.

Figure 10:
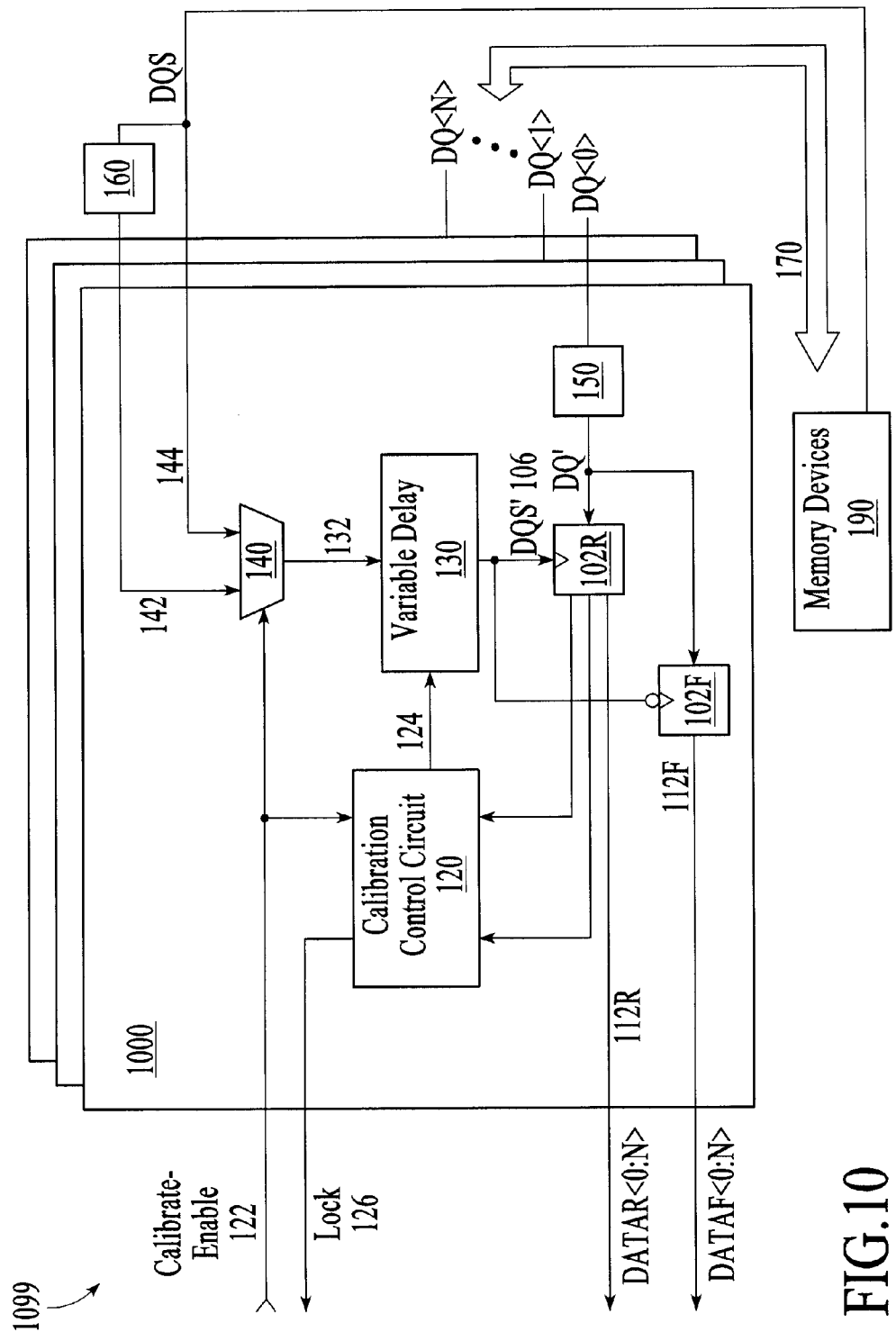
FIG. 10 is a block diagram of a strobe-offset control system for individual data line strobe-offset control in strobe-based DDR memory systems, under an alternative embodiment of FIG. 1.

The strobe-offset control systems described above can be used in numerous memory system types/configurations. As an alternative example, FIG. 10 is a block diagram of a strobe-offset control system 1000 for individual data line strobe-offset control in strobe-based DDR memory systems 1099, under an alternative embodiment of FIG. 1. As described above, the DDR memory system 1099 transfers data from the memory devices 190 on both the rising and falling edge of the strobe signal DQS. Consequently, the DDR memory system 1099 is similar to the strobe-based memory system 199 described above with reference to FIG. 1 except for an additional receiver/input sampler 102F that samples/receives data on the falling edge of the sample signal DQS'. Likewise, the strobe-offset control system 1000 is similar to the strobe-offset control system 100 described above with reference to FIG. 1 except for an additional coupling of the variable delay element output signal DQS' to the falling-edge receiver/input sampler 102F.

The strobe-based DDR memory system 1099 includes a rising-edge receiver/input sampler 102R and a falling-edge receiver/input sampler 102F both having data inputs coupled to receive a delay data signal DQ<X>' that has been delayed by a data delay element 150. The data signal DQ includes information of one data bit of a data byte transferred between the receivers/input samplers 102R/102F and one or more memory devices 190 via one or more buses 170. The rising-edge receiver/input sampler 102R and falling-edge receiver/input sampler 102F both receive sample signal DQS' from the variable delay element 130. The rising-edge receiver/input sampler 102R samples the data signal DQ<X> in response to the sample signal DQS' 106 as described above and outputs data signal 112R that includes data DATAR<0:N>. The falling-edge receiver/input sampler 102F samples the data signal DQ<X> in response to the sample signal DQS' 106 as described above and outputs data signal 112F that includes data DATAF<0:N>.

Components of the strobe-offset control system 1000 include a calibration control circuit 120, a variable delay element 130, and a multiplexer 140, but can include and/or couple with additional components as appropriate to the memory system 1099 or host electronic system. The strobe-offset control system 1000 and its various components operate during data transfer operations as described above with reference to FIGS. 1-7.

Figure 11:
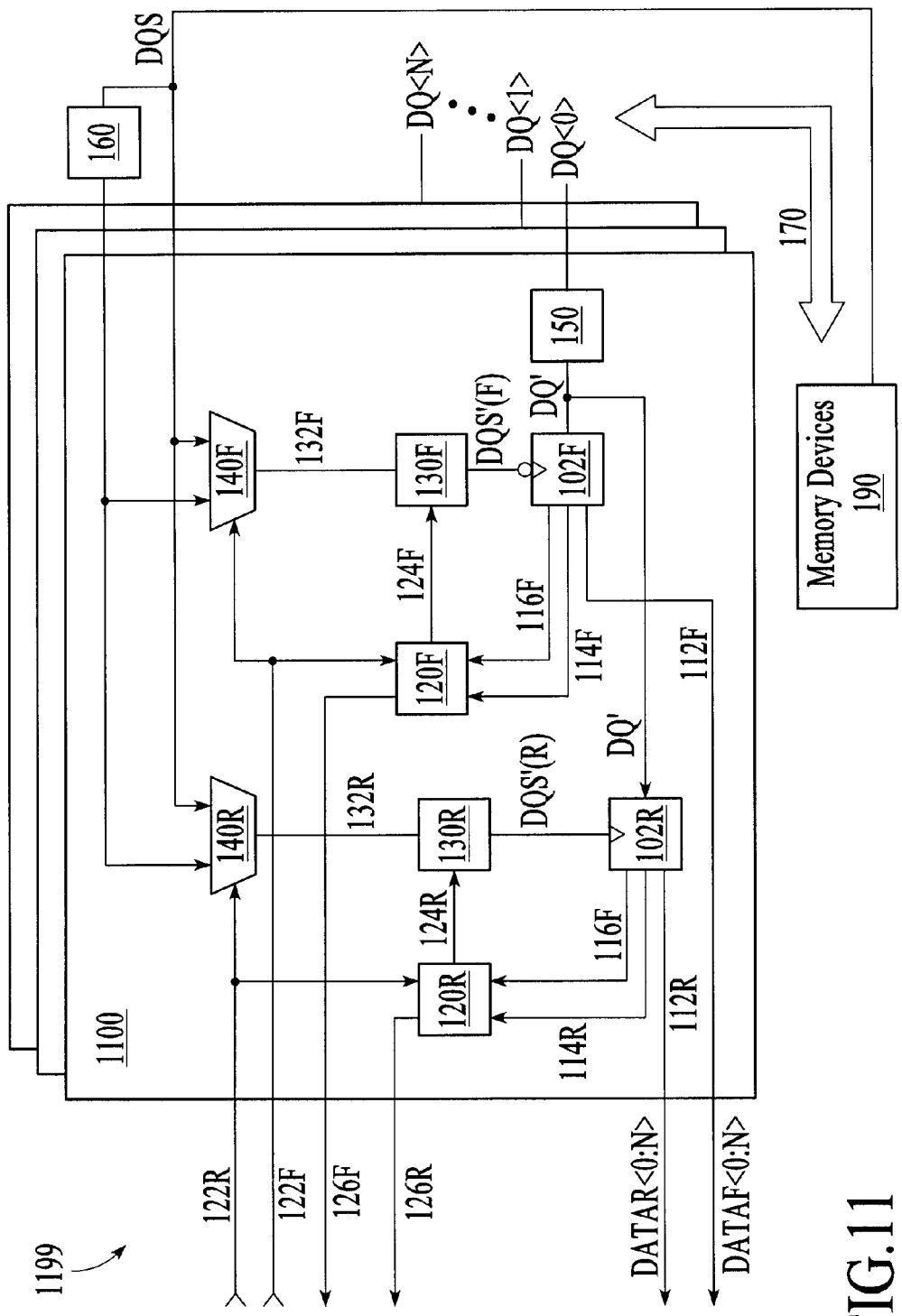
FIG. 11 is a block diagram of a control system for individual data line rising and falling edge strobe-offset control in strobe-based DDR memory controllers, under an alternative embodiment of FIG. 10.

Another alternative example of a strobe-offset control system provides separate strobe-offset control for rising and falling edges of the strobe signal DQS. FIG. 11 is a block diagram of a control system 1100 for individual data line rising and falling edge strobe-offset control in strobe-based DDR memory controllers 1199, under an alternative embodiment of FIG. 10. As described previously, the DDR memory system 1199 transfers data from the memory devices on both the rising and falling edge of the strobe signal DQS. Consequently, the DDR memory system 1199 is similar to the strobe-based memory system 199 described above with reference to FIG. 1 except for an additional receiver. The strobe-based DDR memory system 1199 thus includes a rising-edge receiver/input sampler 102R and a falling-edge receiver/input sampler 102F both having data inputs coupled to receive a data signal DQ<X>' that has been delayed by a data delay element 150. The rising-edge receiver/input sampler 102R samples data on the rising edge of a sample signal DQS(R)' while the falling-edge receiver/input sampler 102F samples data on the falling edge of a sample signal DQS(F)'. The data signal DQ includes information of one bit of a data byte transferred between each of receiver/input sampler 102R/102F and one or more memory devices (not shown). The rising-edge receiver/input sampler 102R samples the data signal DQ<X> in response to the sample signal DQS(R)' as described above and outputs data signal 112R that includes data DATAR<0:N>. The falling-edge receiver/input sampler 102F samples the data signal DQ<X> in response to the sample signal DQS(F)' as described above and outputs data signal 112F that includes data DATAF<0:N>.

The strobe-offset control system 1100 is similar to the strobe-offset control system 100 described above with reference to FIG. 1 except that it includes additional components that provide separate strobe-offset control for the rising and falling edges of the strobe signal DQS. The rising-edge strobe-offset control components (generally indicated with suffix "R") include a calibration or offset controller 120R, a variable delay element 130R, and a multiplexer 140R along with corresponding signals 132R, 124R, and 112R, as described above with reference to FIG. 1. Likewise, the falling-edge strobe-offset control components (generally indicated with suffix "F") include a calibration or offset controller 120F, a variable delay element 130F, and a multiplexer 140F along with corresponding signals 132F, 124F, and 112F, as described above with reference to FIG. 1. The strobe-offset control system 1100 can include and/or couple with additional components as appropriate to the memory system 1199 or host electronic system. The strobe-offset control system 1100 operates during data transfer operations as described above with reference to FIGS. 1-7.

Figure 12:
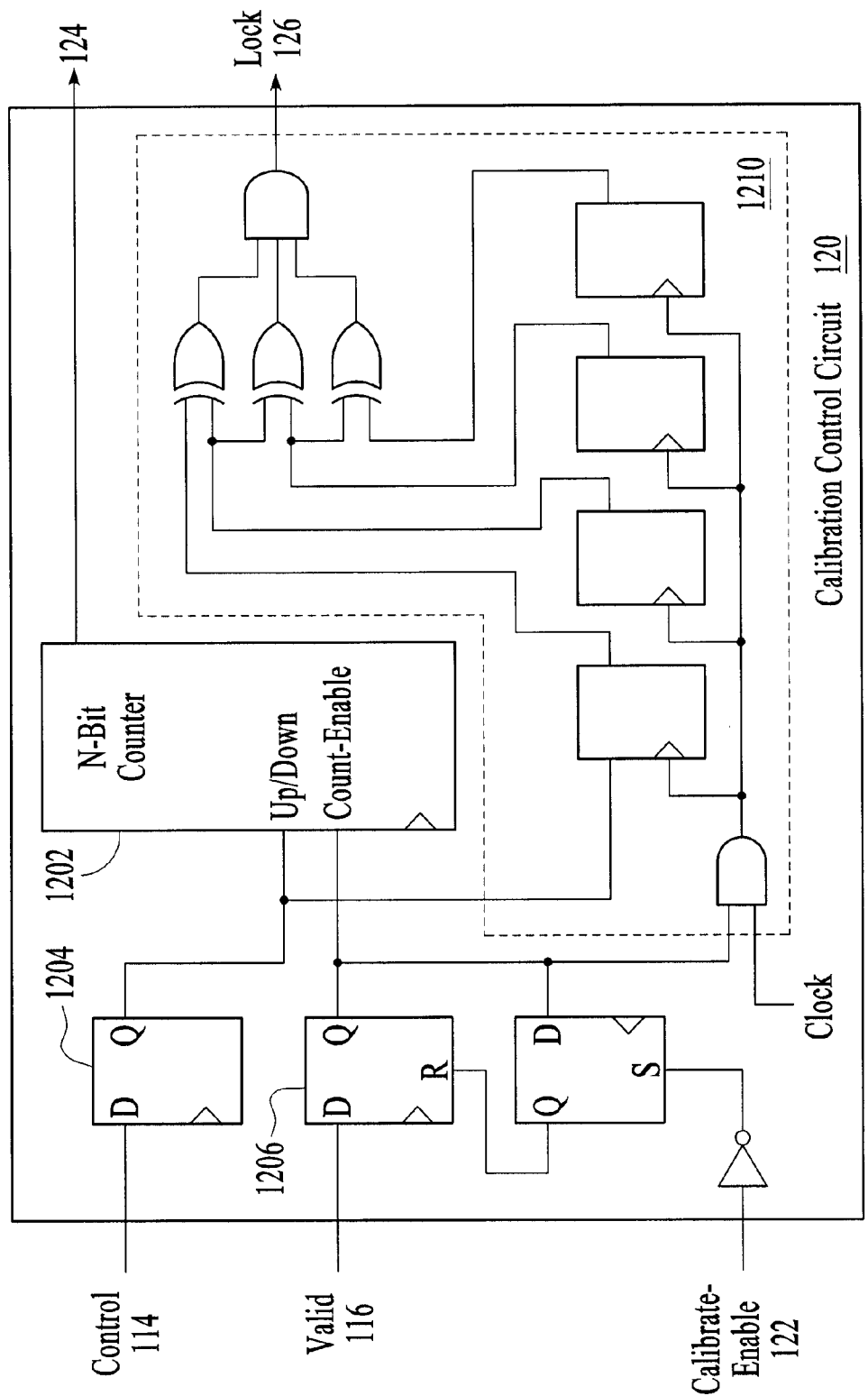
FIG. 12 is a block diagram of a calibration control circuit, under an embodiment.

As described above with reference to FIG. 1 for example, the calibration control circuit 120 of an embodiment uses information of one or more signals received from the receiver 102 in performing adjustments of the variable delay value of delay element 130. FIG. 12 is a block diagram of a calibration control circuit 120, under an embodiment. The calibration control circuit 120 receives an up/down adjustment control signal 114 that is a digital representation of the difference in phase between the strobe signal and the data signal as detected by the receiver. A flip-flop 1204 couples the control signal to an N-bit counter 1202, but the embodiment is not so limited. The calibration control circuit 120 can also receive an optional adjustment valid signal 116 from the receiver that indicates when the adjustment control signal 114 is valid. The adjustment valid signal, when included, is coupled to the N-bit counter 1202 via flip-flop 1206 in an embodiment.

In response to phase difference information of the adjustment control signal 114 the N-bit counter 1202 accumulates the up/down adjustment and generates the delay control signal 124 as appropriate to the detected phase difference. The delay control signal 124 couples to adjust the variable delay value of delay element 130 up or down as appropriate to the detected phase difference.

The calibration control circuit 120 also includes optional circuitry 1210 for detecting a dither condition between the phase of the strobe signal and the data signal as detected by the receiver when the phase of the strobe signal is approximately the same as the phase of the data signal. In response to detecting the dither condition, the circuitry 1210 enables the optional lock signal 126. The lock signal 126 is subsequently output (to the memory controller or other circuitry of the memory system 199) by the calibration control circuit 120 to indicate detected phase alignment of the strobe and data signals.

Figure 13:
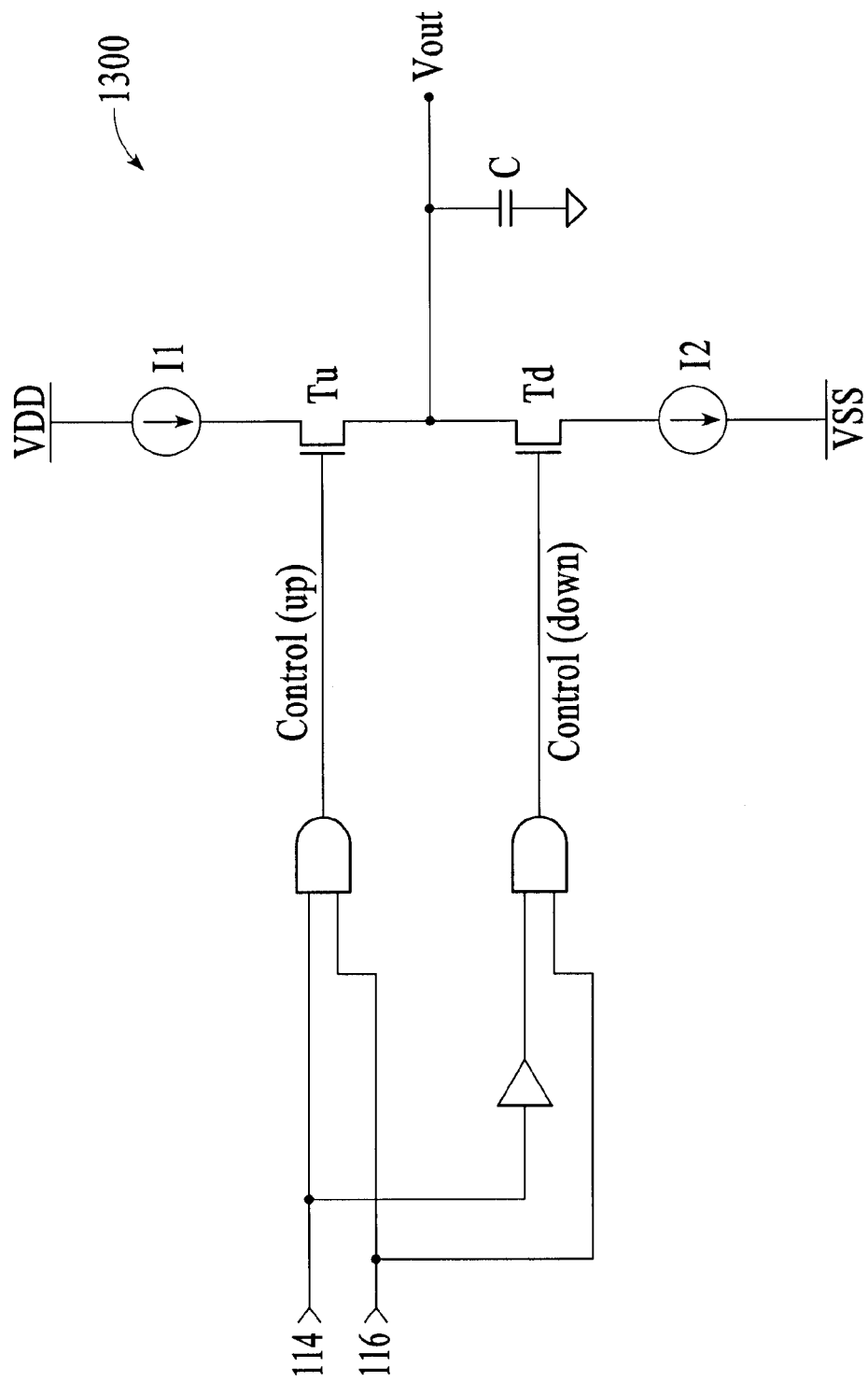
FIG. 13 shows a charge pump that can replace the N-bit counter of a calibration control circuit, under an embodiment.

The N-bit counter 1202 can be replaced by a charge pump in an alternative embodiment of the calibration control circuit 120. As one example, FIG. 13 shows a charge pump 1300 that can replace the N-bit counter 1202, under an embodiment. This charge pump 1300 includes current sources I1 and I2 selectively switched to a capacitor C via one of a control (up) signal/transistor Tu or a control (down) signal/transistor Td. Alternative charge pump circuits can be used.

In operation, the calibration control circuit 120 receives an up/down adjustment control signal 114 that represents the difference in phase between the strobe signal and the data signal as detected by the receiver. Information of the adjustment control signal 114 is used to provide the control (up) signal to the gate of transistor Tu and to provide the control (down) signal to the gate of transistor Td.

In operation, when the control (up) signal is enabled (and the control (down) signal is disabled), transistor Tu causes a first current source I1 to deliver charge onto capacitor C. In contrast, when the control (down) signal is enabled (and the control (up) signal is disabled), transistor Td causes a second current source I2 to sink current with a subsequent decrease in charge on capacitor C. In this manner the charge stored on the capacitor C is representative of the up or down adjustment applied to the variable delay value in response to the detected phase difference between the strobe and data signals. The charge pump 1300 outputs an analog control voltage $V_{out}$ for use in generating the delay control signal 124 (FIG. 1) as appropriate to the detected phase difference. The delay control signal 124 couples to adjust the variable delay value (delay element 130) up or down as appropriate to the detected phase difference, as described above.

The components of the memory systems described above include any collection of computing components and devices operating together. The components of the memory systems can also be components or subsystems within a larger computer system or network. The memory system components can also be coupled among any number of components (not shown), for example other buses, controllers, memory devices, and data input/output (I/O) devices, in any number of combinations. Many of these system components may be soldered to a common printed circuit board (for example, a graphics card or game console device), or may be integrated in a system that includes several printed circuit boards that are coupled together in a system, for example, using connector and socket interfaces such as those employed by personal computer motherboards and dual inline memory modules ("DIMM"). In other examples, complete systems may be integrated in a single package housing using a system in package ("SIP") type of approach. Integrated circuit devices may be stacked on top of one another and utilize wire bond connections to effectuate communication between chips or may be integrated on a single planar substrate within the package housing.

Further, functions of the memory system components can be distributed among any number/combination of other processor-based components. The memory systems described above include, for example, various dynamic random access memory (DRAM) systems. As examples, the DRAM memory systems can include double data rate ("DDR") systems like DDR SDRAM as well as DDR2 SDRAM and other DDR SDRAM variants, such as Graphics DDR ("GDDR") and further generations of these memory technologies, i.e., GDDR2, and GDDR3, but is not limited to these memory systems.

Aspects of the system for per-bit offset control and calibration described herein may be implemented as functionality programmed into any of a variety of circuitry, including programmable logic devices (PLDs), such as field programmable gate arrays (FPGAs), programmable array logic (PAL) devices, electrically programmable logic and memory devices and standard cell-based devices, as well as application specific integrated circuits (ASICs). Some other possibilities for implementing aspects of the per-bit offset control and calibration system include: microcontrollers with memory (such as electronically erasable programmable read only memory (EEPROM)), embedded microprocessors, firmware, software, etc. Furthermore, aspects of the per-bit offset control and calibration system may be embodied in microprocessors having software-based circuit emulation, discrete logic (sequential and combinatorial), custom devices, fuzzy (neural) logic, quantum devices, and hybrids of any of the above device types. Of course the underlying device technologies may be provided in a variety of component types, e.g., metal-oxide semiconductor field-effect transistor (MOSFET) technologies like complementary metal-oxide semiconductor (CMOS), bipolar technologies like emitter-coupled logic (ECL), polymer technologies (e.g., silicon-conjugated polymer and metal-conjugated polymer-metal structures), mixed analog and digital, etc.

Unless the context clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," "above," "below," and words of similar import refer to this application as a whole and not to any particular portions of this application. When the word "or" is used in reference to a list of two or more items, that word covers all of the following interpretations of the word: any of the items in the list, all of the items in the list and any combination of the items in the list.

The above description of illustrated embodiments of the system for per-bit offset control and calibration is not intended to be exhaustive or to limit the system to the precise form disclosed. While specific embodiments of, and examples for, the system for per-bit offset control and calibration are described herein for illustrative purposes, various equivalent modifications are possible within the scope of the system, as those skilled in the relevant art will recognize. The teachings of the system for per-bit offset control and calibration provided herein can be applied to other processing systems, not only for the systems described above.

The elements and acts of the various embodiments described above can be combined to provide further embodiments. These and other changes can be made to the system for per-bit offset control and calibration in light of the above detailed description.

In general, in the following claims, the terms used should not be construed to limit the system for per-bit offset control and calibration to the specific embodiments disclosed in the specification and the claims, but should be construed to include all processing systems that operate under the claims to provide per-bit offset control and calibration. Accordingly, the system for per-bit offset control and calibration is not limited by the disclosure, but instead the scope of the system is to be determined entirely by the claims.

While certain aspects of the system for per-bit offset control and calibration are presented below in certain claim forms, the inventor contemplates the various aspects of the system in any number of claim forms. For example, while only one aspect of the system is recited as embodied in computer-readable medium, other aspects may likewise be embodied in computer-readable medium. Accordingly, the inventor reserves the right to add additional claims after filing the application to pursue such additional claim forms for other aspects of the system for per-bit offset control and calibration.

What is claimed is:

1. A memory controller comprising:

first and second receivers having respective inputs coupled in common to a first input line to receive a data signal from a memory device, the first receiver including circuitry for sampling the data signal in response to a first sample signal and a second receiver including circuitry for sampling the data signal in response to a second sample signal, wherein the first sample signal and the second sample signal are derived from a strobe signal received from the memory device;

a first control circuit to detect a first phase difference between the data signal and the first sample signal and to adjust a first phase of the first sample signal in response to the first phase difference; and a second control circuit to detect a second phase difference between the data signal and the second sample signal and to adjust a second phase of the second sample signal, independently of the first phase, in response to the second phase difference.

2. The memory controller of claim 1 wherein the first sample signal and the second sample signal are delayed differently from the strobe signal.

3. The memory controller of claim 2 wherein the first control circuit further comprises a calibration control circuit coupled to receive an adjustment control signal from the first receiver and to control a propagation delay through the first delay element to adjust the first time period in response to the first phase difference.

4. The memory controller of claim 3 wherein the calibration control circuit comprises circuitry for outputting a lock signal in response to determination of a target propagation delay.

5. The memory controller of claim 4 wherein the calibration control circuit further comprises circuitry for storing information representative of the target propagation delay.

6. The memory controller of claim 2 wherein the first receiver, the calibration control circuit, and the first delay element are coupled to form at least part of a delay-locked loop (DLL) circuit.

7. The memory controller of claim 2 further comprising:
a first delay element to delay the strobe signal by a first time period to generate a delayed strobe signal;
a first multiplexer to receive the strobe signal and the delayed strobe signal and to output the first timing signal, the first sample signal being derived from the first timing signal; and
a second multiplexer to receive the strobe signal and the delayed strobe signal and to output a second timing signal, the second sample signal being derived from the second timing signal.

8. The memory controller of claim 7 wherein the first multiplexer comprises circuitry to receive a first mode control signal, wherein the first mode control signal selects one of the strobe signal and the delayed strobe signal to be output as the first timing signal.

9. The memory controller of claim 8 wherein the first mode control signal selects the delayed strobe signal to be output as the first timing signal when the memory controller is in a receive mode, and wherein the mode control signal selects the strobe signal to be output as the first timing signal when the memory controller is in a calibration mode.

10. The memory controller of claim 9 wherein the first receiver functions as an input sampler when the memory controller is in the receive mode and wherein the first receiver functions as an input sampler when the memory controller is in the calibration mode.

11. The memory controller of claim 8 wherein the first calibration control circuit further comprises circuitry to receive the first mode control signal.

12. The memory controller of claim 1 wherein the first receiver comprises circuitry for sampling the data signal in response to a rising edge of the first sample signal and the second receiver comprises circuitry for sampling the data signal in response to a falling edge of the second sample signal.

13. The memory controller of claim 1 further comprising a delay element to delay the data signal by a time period.

14. The memory controller of claim 13 wherein the delay element is coupled to receive the data signal from the memory device and to output the data signal to the first receiver.

15. The memory controller of claim 1, wherein the memory device is a Double Data Rate (DDR) device.

16. A method of performing timing calibration in a memory system, the method comprising:
receiving a data signal from a memory device via a first input line;
detecting a first phase difference between the data signal and a first sample signal, wherein the first sample signal derived from a strobe signal;
detecting a second phase difference between the data signal and a second sample signal, wherein the second sample signal is derived from the strobe signal;
adjusting a first phase of the first sample signal in response to the first phase difference; and
adjusting a second phase of the second sample signal in response to the second phase difference.

17. The method of claim 16 further comprising:
generating the first sample signal by applying a first phase offset to a first timing signal; and
generating the second sample signal by applying a second phase offset to a second timing signal.

18. The method of claim 17 further comprising:
receiving the strobe signal from the memory device;
receiving a first mode control signal and a second mode control signal;
generating the first timing signal by selectively applying a third phase offset to the strobe signal in response to the first mode control signal; and
generating the second timing signal by selectively applying the third phase offset to the strobe signal in response to the second mode control signal.

19. The method of claim 16 further comprising adjusting a third phase offset of the data signal.

20. An offset control system comprising:
means for detecting a first phase difference between a data signal and a first sample signal, the data signal being received from a memory device via a first input line, wherein the first sample signal is derived from a strobe signal;
means for detecting a second phase difference between the data signal and a second sample signal, wherein the second sample signal is derived from the strobe signal;
means for adjusting a first phase of the first sample signal in response to the first phase difference;
means for adjusting a second phase of the second sample signal in response to the second phase difference;
means for generating the first sample signal by applying a first phase offset to a first timing signal; and
means for generating the second sample signal by applying a second phase offset to a second timing signal.

* * * * *